(12) United States Patent
Mort et al.

(10) Patent No.: US 10,547,294 B2
(45) Date of Patent: Jan. 28, 2020

(54) DESKEW CIRCUIT FOR AUTOMATED TEST SYSTEMS

(71) Applicant: Analog Devices, Inc., Norwood, MA (US)

(72) Inventors: Andrew Nathan Mort, Tewksbury, MA (US); Christopher C. McQuilkin, Hollis, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/618,923

(22) Filed: Jun. 9, 2017

(65) Prior Publication Data
US 2018/0358957 A1 Dec. 13, 2018

(51) Int. Cl.
*H03K 5/14* (2014.01)
*H03K 5/00* (2006.01)

(52) U.S. Cl.
CPC ..... *H03K 5/14* (2013.01); *H03K 2005/00084* (2013.01)

(58) Field of Classification Search
CPC ........... H03K 5/14; H03K 2005/00084; G01R 31/2834
See application file for complete search history.

(56) References Cited

U.S. PATENT DOCUMENTS

| | | | | |
|---|---|---|---|---|
| 5,544,203 A * | 8/1996 | Casasanta | ................ | G06F 1/10 327/149 |
| 5,675,341 A * | 10/1997 | Vallancourt | ........... | H03M 1/366 341/158 |
| 5,682,353 A | 10/1997 | Eitan et al. | | |
| 5,831,459 A * | 11/1998 | McDonald | ................ | G06F 1/10 327/141 |
| 6,049,241 A | 4/2000 | Brown et al. | | |
| 6,133,773 A * | 10/2000 | Garlepp | ................... | H03K 5/13 327/231 |
| 7,061,283 B1 * | 6/2006 | Ghia | ................... | H04L 25/0288 327/108 |
| 7,222,273 B2 * | 5/2007 | Cho | ....................... | G11C 29/56 365/201 |
| 7,276,950 B2 | 10/2007 | Monma et al. | | |
| 7,576,580 B2 | 8/2009 | Wang | | |
| 7,656,983 B2 | 2/2010 | Klowden et al. | | |
| 7,795,942 B2 * | 9/2010 | Quan | ........................ | G05F 3/16 327/170 |
| 8,804,397 B2 | 8/2014 | Aleksic et al. | | |
| 9,264,055 B2 | 2/2016 | Aleksic et al. | | |
| 9,698,970 B1 * | 7/2017 | Cho | ........................ | H03L 7/081 |

(Continued)

*Primary Examiner* — Thomas J. Hiltunen
(74) *Attorney, Agent, or Firm* — Schwegman Lundberg & Woessner, P.A.

(57) ABSTRACT

This disclosure is in the field of electronics and more specifically in the field of timing control electronics. In an example, a timing control system can include or use an array of circuit cells, and each cell can provide a signal delay using a fixed delay or interpolation. The interpolation can include, in one or more cells, using three timing signals with substantially different delays to create a delayed output signal. Linearity of the delayed output signal is thereby improved. In an example, an impedance transformation circuit can be applied to improve a bandwidth in one or more of the cells to thereby improve the bandwidth of the timing control system.

21 Claims, 10 Drawing Sheets

(56) References Cited

U.S. PATENT DOCUMENTS

| | | | |
|---|---|---|---|
| 2001/0002799 A1* | 6/2001 | Saeki | G06F 1/10 327/292 |
| 2002/0169994 A1* | 11/2002 | Yang | G06F 1/10 713/503 |
| 2005/0218953 A1 | 10/2005 | Slawecki | |
| 2006/0164145 A1* | 7/2006 | Poskatcheev | H03K 5/13 327/276 |
| 2009/0309638 A1* | 12/2009 | Delage | H03K 3/0322 327/158 |
| 2011/0156757 A1* | 6/2011 | Hayashi | G01R 31/31726 327/3 |
| 2011/0221486 A1* | 9/2011 | Hirata | H03L 7/0812 327/146 |
| 2016/0134267 A1* | 5/2016 | Adachi | H03K 5/159 327/237 |

* cited by examiner

DESKEW CIRCUIT FOR AUTOMATED TEST SYSTEMS

BACKGROUND

A test system for electronic device testing can include a pin driver circuit that provides a voltage test pulse or current test pulse to a device under test (DUT). In response, the test system can be configured to measure a response from a DUT, such as to determine whether the DUT meets one or more specified operating criteria.

In an example, test systems can include dynamic controls for delivering timing signals, including controls for synchronizing or deskewing multiple signals to be provided to, or received from, a DUT. The timing signals can be used to perform tests on a variety of integrated circuit devices. In each test, one or more timing signals can be applied to respective pins of a DUT, and corresponding response signals can be analyzed. The timing signals may travel to each DUT pin by a different path, and response signals from the DUT can similarly travel different paths to response analysis circuitry. Such differences in propagation paths, or other influences on signal timing or propagation, can influence test results. Various techniques can be used to correct, or to more precisely control, the timing of test signals that are desired to arrive at a DUT at precise times or in synchronization.

Timing errors are generally referred to herein as "skew". In an early approach to deskewing signals, a number of manually adjustable potentiometers were associated with each pin for aligning in time each pin's input signal. The potentiometers could be adjusted whenever the system required recalibration.

In another approach, a deskewing system can include a sequence of stages for delaying the signal. A more coarse stage can delay a signal by multiples of a predetermined delay interval and a finer stage can provide for finer adjustment of the delay interval.

SUMMARY OF THE DISCLOSURE

The present inventors have recognized, among other things, that a problem to be solved includes providing a test system that can synchronize timing signals, or edge placement in stimulus signals, and thereby reduce or eliminate timing errors at a device under test, or DUT. The inventors have further recognized that the problem can include time non-linearity at or near decision threshold regions. In an example, the non-linearity problem can be pronounced near a midscale of available delay code inputs that define a delay magnitude characteristic.

In an example, a solution to the above-described problems can include or use a deskew system for providing a programmable delay. The deskew system can include multiple delay cells coupled in a series. In an example, a first cell of the multiple delay cells includes a first input node and a first output node, and the first cell is configured to provide a maximum, minimum, or intermediate delay to an input signal at the first input node. The first cell can include one or more circuits or modules configured to generate or provide a delay. In an example, the first cell includes an early signal input node, a mid signal input node, and a late signal input node. The first cell can be configured to provide a delayed output signal at the first output node based on a delay adjust code and signals at the early, mid, and late signal input nodes. The delay adjust code can be user-specified, and indicates a delay amount to apply to the input signal. The early, mid, and late signal input nodes can be configured to receive signals sequentially in time.

In an example, the deskew system can include or use a current splitter configured to apportion early, mid, and late currents to first, second, and third current signal paths, respectively, wherein the current signal paths are respectively modulated by signals at the early, mid, and late signal input nodes. The current splitter can be configured to apportion the current signals based on the delay adjust code. When the delay adjust code indicates a minimum delay amount, the current splitter can apportion substantially all of the source current signal to the first current signal path modulated by the signal at the early signal input node, or when the delay adjust code indicates an intermediate delay amount, the current splitter can apportion substantially all of the source current to the second current signal path modulated by the signal at the mid signal input node, or when the delay adjust code indicates a maximum delay amount, the current splitter can apportion substantially all of the source current signal to the third current signal path modulated by the signal at the late signal input node.

In an example, a solution to the above-described problems can additionally or alternatively include or use a method for providing a programmable delay signal. The method can include, among other things, receiving an input signal to be delayed at a forward input node of a first deskew cell in a series of deskew cells, and receiving a delay adjust code indicative of a specified delay amount. The method can include apportioning a source current signal to first, second, and/or third current signal paths in the first deskew cell based on the delay adjust code to provide a minimum delay, maximum delay, or intermediate delay, respectively. The method can further include switching first, second, and/or third switches respectively provided in the first, second, and third current signal paths to modulate current signals therethrough, wherein switching the first switch includes using the input signal, wherein switching the third switch includes using a forward signal provided from the first deskew cell to an adjacent cell in the series of deskew cells, and wherein switching the second switch includes using a further delayed signal received from the reverse output of the same adjacent cell in the series of delay cells. The method can further include providing the output signal based on the switched signals of the first, second, and/or third switches. In an example, the method includes providing a minimum delay output signal when the first switch conducts current in the first current signal path and the second and third switches are not conducting, or providing a maximum delay output signal when the second switch conducts current in the second current signal path and the first and third switches are not conducting, or providing an intermediate delay output signal when the third switch conducts current in the third current signal path and the first and second switches are not conducting.

This Summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

Automated test equipment (ATE) systems are generally configured to perform tests and determine whether a device under test (DUT) meets one or more performance specifications. Precise and reproducible test signals, or vectors, can be provided by an ATE system to determine whether a particular DUT complies with a specified timing or response specification.

One characteristic of an ATE system is its edge placement accuracy, a characteristic that quantifies a precision and repeatability of test signals provided by the system to a DUT. Differences in circuit board traces, transmission signal length, parasitic loading effects, and other physical characteristics can influence test signal behavior and can cause timing errors, such as between signals provided at different pins on a DUT. In an example, a programmable test signal delay cell, also known as a deskew circuit or timing vernier, can be used to help synchronize vector timing or edge placement and thereby reduce or eliminate timing errors at a DUT.

Figure 1:
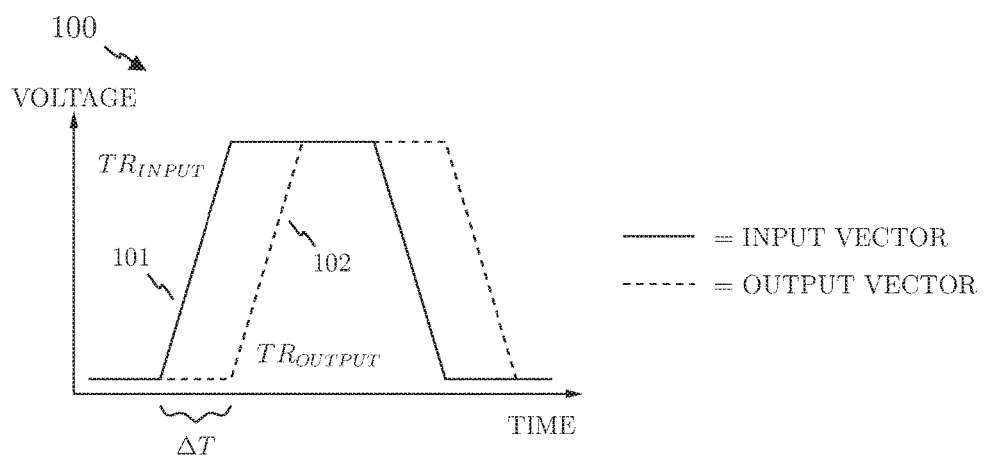
FIG. 1 illustrates generally an example of an output signal as a delayed version of an input signal.

FIG. 1 illustrates generally an example of an output signal as a delayed version of an input signal. FIG. 1 includes a first chart 100 that shows a result of using deskew circuit to delay an input signal in time. The first chart 100 includes an input signal vector 101 and an output signal vector 102. The deskew circuit receives the input signal vector 101 at an input node and provides the output signal vector 102 as a delayed version of the input signal vector 101. Under ideal conditions, the deskew circuit delays the input signal vector 101 by a precise, adjustable amount without altering signal fidelity or bandwidth, to provide the output signal vector 102 as an exact replica of the input signal vector 101, except for a shift in time. The example of FIG. 1 demonstrates no bandwidth limitation when the input signal rise time $TR_{INPUT}$ (e.g., corresponding to the input signal vector 101) matches the output signal rise time $TR_{OUTPUT}$ (e.g., corresponding to the output signal vector 102). The magnitude of the delay duration $\Delta T$ can be specified by a Delay Adjust Code, such as can include a digital or analog control signal input to a deskew circuit.

Figure 2:
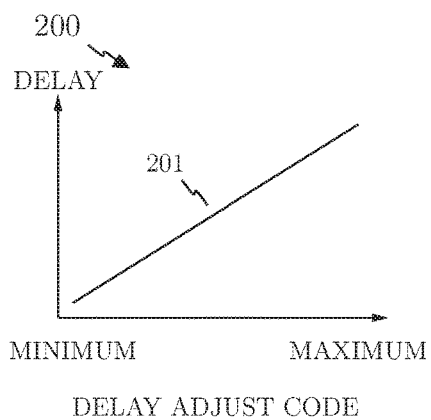
FIG. 2 illustrates generally a relationship between a Delay Adjust Code and a signal delay magnitude.

FIG. 2 illustrates generally a second chart 200 showing a relationship between a Delay Adjust Code and a signal delay magnitude. A Delay Adjust Code can include an analog or digital signal and can be provided to a deskew circuit to indicate an amount or magnitude of delay to apply to the input signal 101 in FIG. 1. In the example, the Delay Adjust Code can be one of multiple different values ranging from a specified minimum (e.g., zero delay) to a specified maximum (e.g., a maximum amount of delay that can be provided by the deskew circuit). In the example of FIG. 2, a first line 201 indicates there is a linear relationship between the Delay Adjust Code and the corresponding signal delay magnitude.

Figure 3:
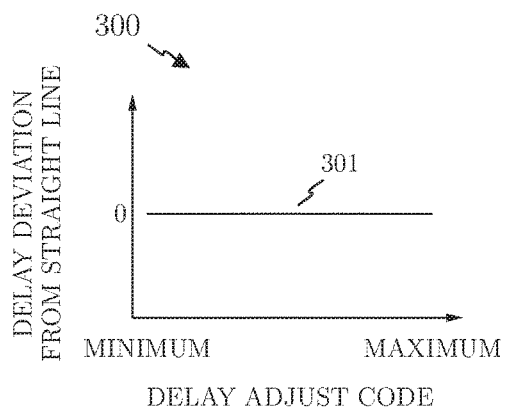
FIG. 3 illustrates generally a relationship between delay linearity error and a Delay Adjust Code.

FIG. 3 illustrates generally a third chart 300 showing a relationship between delay linearity error and a Delay Adjust Code. Delay linearity error is sometimes referred to as a Delay Deviation. In the example, a second line 301 demonstrates that there is no linearity error in the ideal deskew relationship shown in FIG. 2 by the first line 201. In other examples, the relationship can be non-linear, and in such case the second line 301 would deviate from a horizontal line. Generally, it is preferred to have a predictable and repeatable relationship between Delay Adjust Code and resulting signal delay at the output. Non-linearity or unpredictability is undesirable, since it can introduce edge placement uncertainty and thereby result in faulty or inconsistent measurement results.

Figure 4A:
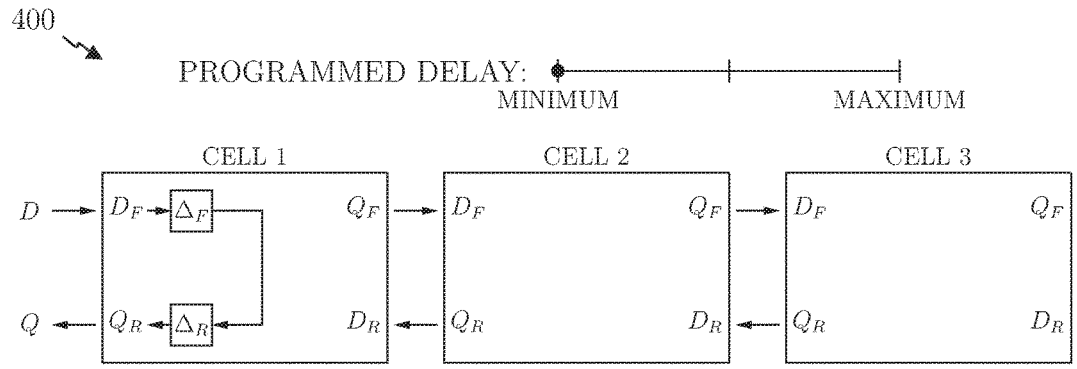
FIGS. 4A-4C illustrate generally examples of deskew cell arrays.
Figure 4B:
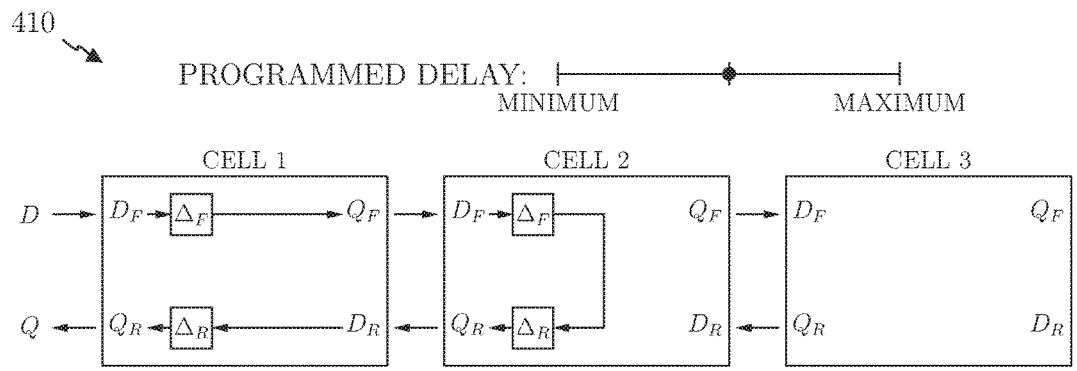
Figure 4C:
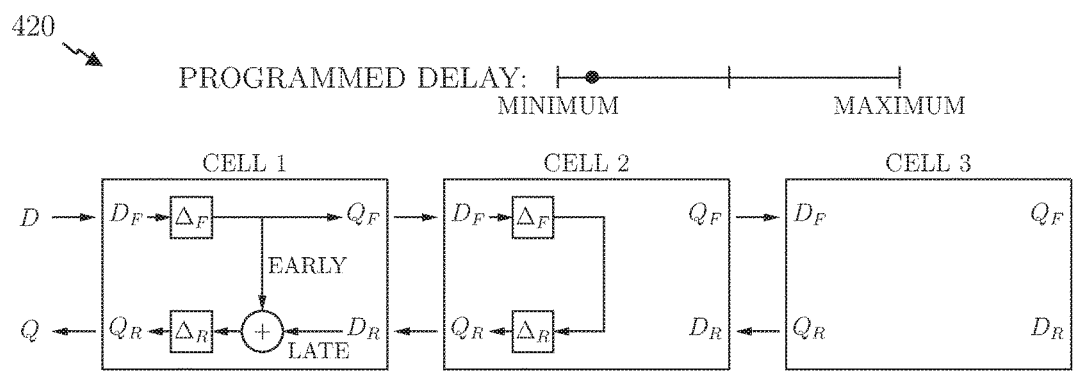

Various deskew circuit topologies can be used to provide an adjustable delay. One such topology is shown in FIGS. 4A-4C. FIGS. 4A-4C illustrate generally examples of deskew cell arrays. For example, FIG. 4A includes a first deskew cell array 400, FIG. 4B includes a second deskew cell array 410, and FIG. 4C includes a third deskew cell array 420. In each example, the illustrated array, or illustrated portion of a larger array, includes three discrete cells labeled "Cell 1", "Cell 2", and "Cell 3". Each of the cells is configured to receive an input signal via a forward input node $D_F$, delay the input signal by a delay duration, and then provide a delayed output signal via a reverse output node $Q_R$. If a greater delay amount is required than can be provided by a particular cell, then the particular cell can transmit the signal to an adjacent cell via a forward output node $Q_F$. The particular cell then receives a delayed signal from the adjacent cell via a reverse input node $D_R$, as further explained below. The Programmed Delay line, in each example, provides an indication of the Delay Adjust Code relative to the Minimum delay and the Maximum delay available from the three-cell array.

In the example of the first deskew cell array 400, the array provides a minimum delay, as shown on the Programmed Delay line. In this example, a first cell, Cell 1, is configured in a loop-back configuration. In this configuration, the first deskew cell array 400 can receive an input signal D, delay the signal by a forward delay duration $\Delta_F$ and a reverse delay $\Delta_R$ in Cell 1 and provide a delayed output signal Q. In the example of the first deskew cell array 400, a total delay from the input signal D to the delayed output signal Q is $(\Delta_F+\Delta_R)$.

In the example of the second deskew cell array 410, the array provides a first intermediate delay, greater than the minimum delay, as shown on the Programmed Delay line. The first intermediate delay is generated using a combination of Cell 1 and an adjacent cell, Cell 2, where Cell 1 is configured in a pass-through configuration and Cell 2 is configured in a loop-back configuration. As shown in the figure, an input signal D enters the deskew, where it passes through Cell 1 to Cell 2 and back to Cell 1, and exits the deskew as a delayed output signal Q. The total delay in this example is $(2\Delta_F+2\Delta_R)$, because the signal is delayed by the forward delay $\Delta_F$ of Cell 1, the forward delay $\Delta_F$ of Cell 2, the reverse delay $\Delta_R$ of Cell 2, and the reverse delay $\Delta_R$ of Cell 1.

In the example of the third deskew cell array 420, the array provides a second intermediate delay, which is greater than the minimum delay and smaller than the first intermediate delay. This delay is provided by interpolating between an early delay signal and a late delay signal, where Cell 1 is configured in an interpolating configuration and Cell 2 is configured in a loop-back configuration. The early delay signal can be generated by delaying the input signal D by a first delay amount, such as the forward delay $\Delta_F$ of Cell 1, for a total delay of $\Delta_F$. The late delay signal can be generated by delaying the early delay signal, which already has a delay of $\Delta_F$, by the forward delay $\Delta_F$ of Cell 2 and the reverse delay $\Delta_R$ of Cell 2, for a total delay of $(2\Delta_F+\Delta_R)$. The interpolation between the early delay signal and the late delay signal will result in an interpolation delay signal with a total delay between $\Delta_F$ and $(2\Delta_F+\Delta_R)$. Cell 1, then, delays the interpolation delay signal by the reverse delay $\Delta_R$ and provides a delayed output signal Q, with a total delay between $1\times(\Delta_F+\Delta_R)$ and $2\times(\Delta_F+\Delta_R)$. In this way, the deskew can provide any delay between the minimum delay and the first intermediate delay.

The examples of FIGS. 4A-4C can be extended to understand how a deskew with many cells can provide a delay between a Minimum delay and a Maximum delay. By selecting a middle cell (e.g., Cell n) to be in an interpolation configuration, placing all previous cells (e.g., Cell 1 to Cell (n-1)) to be in a pass-through configuration, and placing an adjacent cell following Cell n (e.g., Cell (n+1)) to be in a loop-back configuration, a delay between $n\times(\Delta_F+\Delta_R)$ and $(n+1)\times(\Delta_F+\Delta_R)$ can be provided. In this manner, any delay amount between the Minimum delay and the Maximum delay can be provided by changing which cell is Cell n, or in an interpolation configuration, such as while keeping all previous cells in a pass-through configuration and a next or subsequent cell in a loop-back configuration.

The examples of FIGS. 4A-4C motivate a need for a system or method to generate or provide fixed delays (i.e., the forward delay $\Delta_F$ and the reverse delay $\Delta_R$) and a system or method to interpolate between two signals with substantially different delays. In an example, a delayed signal can be generated by switching a current into a node to charge a capacitance.

Figure 5:
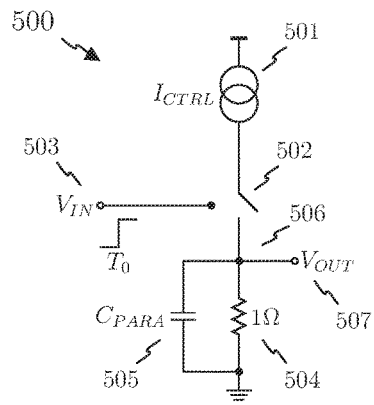
FIG. 5 illustrates generally an example of a circuit that can be used to generate a delay.

FIG. 5 illustrates generally an example of a first circuit 500 that can be used to generate a delay. The example includes a first current source 501 (e.g., a fixed-amplitude DC source), a first switch 502 coupled to the first current source, and a signal input node 503. An input signal $V_{IN}$ at the signal input node 503 controls the first switch 503. When the input signal $V_{IN}$ at the signal input node 503 is high (e.g., when $V_{IN}$ is at or above the midscale voltage, or 0.5 V in this example), the first switch 502 is closed and it conducts a source current signal $I_{CTRL}$ from the first current source 501 to a summing node 506. The summing node 506 is coupled to an output node 507, a load resistor 504, and a capacitor 505 (e.g., representing a parasitic capacitance of the circuit), designated $C_{PARA}$. In an example, the output node 507, the load resistor 504, the capacitor 505, and the summing node 506 comprise an output circuit block that can be used or applied with other delay switching stages. When the input signal $V_{IN}$ at the signal input node 503 is low (e.g., below the midscale voltage, or 0.5 V in this example), the first switch 502 is open and a source current signal from the first current source 501 is prevented from charging the summing node 506.

Figure 6:
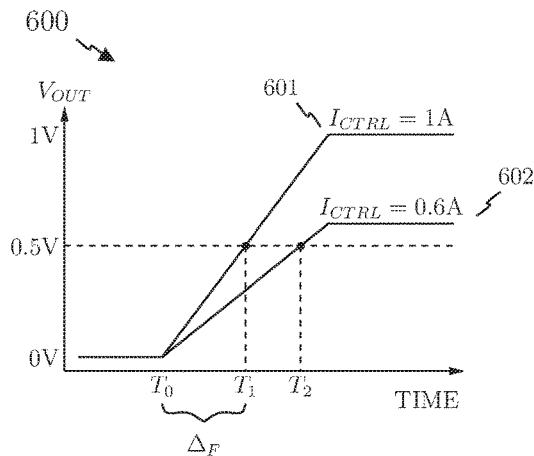
FIG. 6 illustrates generally an example showing a relationship between an output node signal and a source current signal.

FIG. 6 illustrates generally an example showing a first relationship between an output node signal and a source current signal. The example includes a chart 600 showing the voltage $V_{OUT}$ at the output node 507 of the circuit of FIG. 5. In this discussion, it is generally assumed that a signal transition occurs at a point in time when the voltage of a node crosses a midscale voltage, or 0.5 V in these examples. In an example, the input signal $V_{IN}$ at the signal input node 503 transitions (e.g., from low to high) at a transition time $T_0$. Following the transition time, the first switch 502 can close and the source current signal $I_{CTRL}$ can charge the capacitor 505 and the load resistor 504. When $I_{CTRL}$ is 1 amp, corresponding to a first trace 601 in the chart 600, the voltage $V_{OUT}$ at the output node 507 transitions from 0 V to 1 V over a first charge interval. The voltage $V_{OUT}$ at the output node 507 charges to 0.5 V at a time $T_1$ following the transition at time $T_0$. In this way, a signal with a fixed delay $(T_1-T_0)$, such as can be used as the forward delay $\Delta_F$, can be generated from the input signal $V_{IN}$. If $I_{CTRL}$ is reduced from 1 amp to 0.6 amps, then the voltage $V_{OUT}$ at the output node 507 charges to 0.5 V at a time $T_2$ following the transition at time $T_0$, as illustrated by a second trace 602 in the chart 600. When $I_{CTRL}$ is reduced, the time to charge the output node 507 to 0.5 V increases. That is, the slew rate of $V_{OUT}$ at the output node 507 depends on the magnitude of the source current signal $I_{CTRL}$ from the first current source 501.

Figure 7:
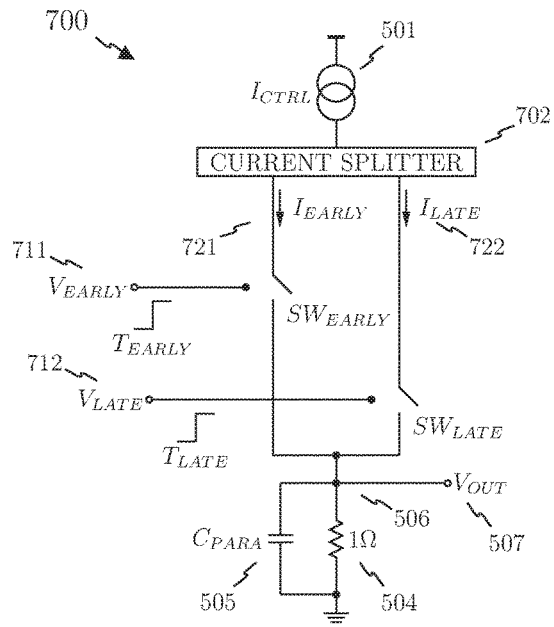
FIG. 7 illustrates generally an example of a circuit that can be used to generate a delay.

FIG. 7 illustrates generally an example of a second circuit 700 that can be used to generate a delay. In an example, the second circuit 700 shows a configuration that can be used to interpolate between two input signals and generate a fixed delay (see, e.g., the discussion of FIGS. 4A-4C). A current splitter 702 (e.g., a circuit configured to divide or apportion a current signal) receives the source current signal $I_{CTRL}$ from the current source 501 and divides the source current signal into early and late currents, $I_{EARLY}$ and $I_{LATE}$, in respective first and second current signal paths 721 and 722. The current splitter 702 divides or apportions the source current signal $I_{CTRL}$ based on a specified delay amount or delay duration, such that the sum of $I_{EARLY}$ and $I_{LATE}$ is less than or equal to $I_{CTRL}$. The first current signal path 721 includes an early switch, $SW_{EARLY}$, and the second current signal path 722 includes a late switch, $SW_{LATE}$. The early and late switches are separately actuated by input signals at early and late signal input nodes 711 and 712, respectively. Following the early and late switches, the first and second current signal paths 721 and 722 are coupled to the summing node 506, which is also coupled to the load resistor 504, the capacitor 505, and the output node 507. As explained above in the example of FIG. 5, the load resistor 504, the capacitor 505, the summing node 506, and the output node 507 comprise an output circuit block that is used or applied with various delay switching stages; thus the summing node 506 in FIG. 5 is understood as being part of a first output circuit block instance and the summing node 506 in FIG. 7 is understood as being part of a different second output circuit block instance.

Figure 8:
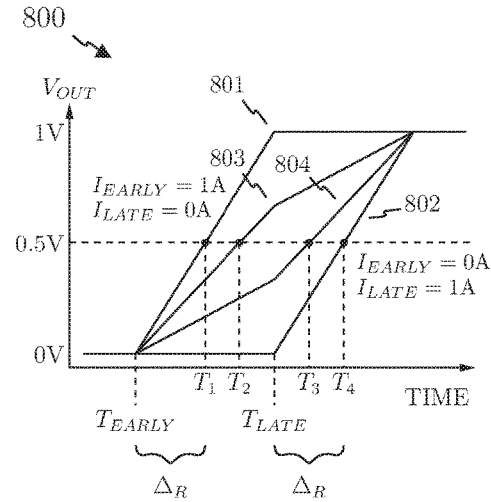
FIG. 8 illustrates generally an example showing a relationship between an output node signal and a source current signal.

FIG. 8 illustrates generally an example showing a second relationship between an output node signal and a source current signal. The example of FIG. 8 includes a chart 800 showing the voltage $V_{OUT}$ at the output node 507 of the circuit of FIG. 7, according to examples of different delays. A first and second trace 801 and 802 correspond to circuit configurations that provide minimum and maximum delays, respectively. The first trace 801 corresponds to a circuit configuration wherein the current splitter 702 provides a 1 amp current signal to the first current signal path 721 and provides no current signal to the second current signal path 722. This results in the output node 507 charging to the midscale voltage, 0.5 V, at time $T_1$, due to a signal $V_{EARLY}$ transitioning from low to high, at time $T_{EARLY}$, at the early signal input node 711. The second trace 802 corresponds to a circuit configuration wherein the current splitter 702 provides a 1 amp current signal to the second current signal path 722 and provides no current signal to the first current signal path 721. This results in the output node 507 charging to 0.5 V at time $T_4$, due to a signal $V_{LATE}$ transitioning from low to high, at time $T_{LATE}$, at the late signal input node 712. The third and fourth traces 803 and 804 show intermediate delays, where the current splitter 702 divides the 1 amp source current signal, $I_{CTRL}$, between the first and second current signal paths 721 and 722. The third trace 803 corresponds to a circuit configuration where the first current signal path 721 has a larger current than the second current signal path 722, resulting in the output node 507 charging to 0.5 V at time $T_2$. The fourth trace 804 corresponds to a circuit configuration where the second current signal path 722 has a larger current than the first current signal path 721, resulting in the output node 507 charging to 0.5 V at time $T_3$.

The examples of FIG. 8 thus shows generally that the second circuit 700 in FIG. 7 can produce a signal that is selectively and adjustably delayed, relative to an input signal, based on the amount of current that is provided to each of the first and second current signal paths 721 and 722 by the current splitter 702. In the third trace 803, where there is more current distributed to the first current signal path 721, the voltage $V_{OUT}$ transitions at time $T_2$, which is closer to the minimum delay transition at time $T_1$ than the maximum delay transition at time $T_4$. As more current is passed to the second current signal path 722 by the current splitter 702, the resulting signal transition shifts closer to the maximum delay transition, such as corresponding to the fourth trace 804. In this way, the source current signal $I_{CTRL}$ can be divided in any proportion or ratio to provide an intermediate delay amount between the minimum and maximum delays.

Referring again to FIG. 8, the slew rate of the first trace 801, corresponding to the minimum delay, can be substantially the same as the slew rate of the second trace 802, corresponding to the maximum delay. Therefore, delay from $T_{EARLY}$ to $T_1$ is substantially the same as the delay from $T_{LATE}$ to $T_4$. This also implies that the delay from $T_1$ to $T_4$ is substantially the same as the delay from $T_{EARLY}$ to $T_{LATE}$. Therefore, the resulting signal transition can be an interpolation between the signals $V_{EARLY}$ and $V_{LATE}$ and a function of a fixed delay (e.g., $T_1$-$T_{EARLY}$, or $T_4$-$T_{LATE}$), such as can be represented by the reverse delay $\Delta_R$. The interpolation, which can also be considered an adjustable delay between 0 and ($T_{LATE}$-$T_{EARLY}$), is determined by the relationship between, or values of, $I_{EARLY}$ and $I_{LATE}$ provided by the current splitter 702.

Figure 9:
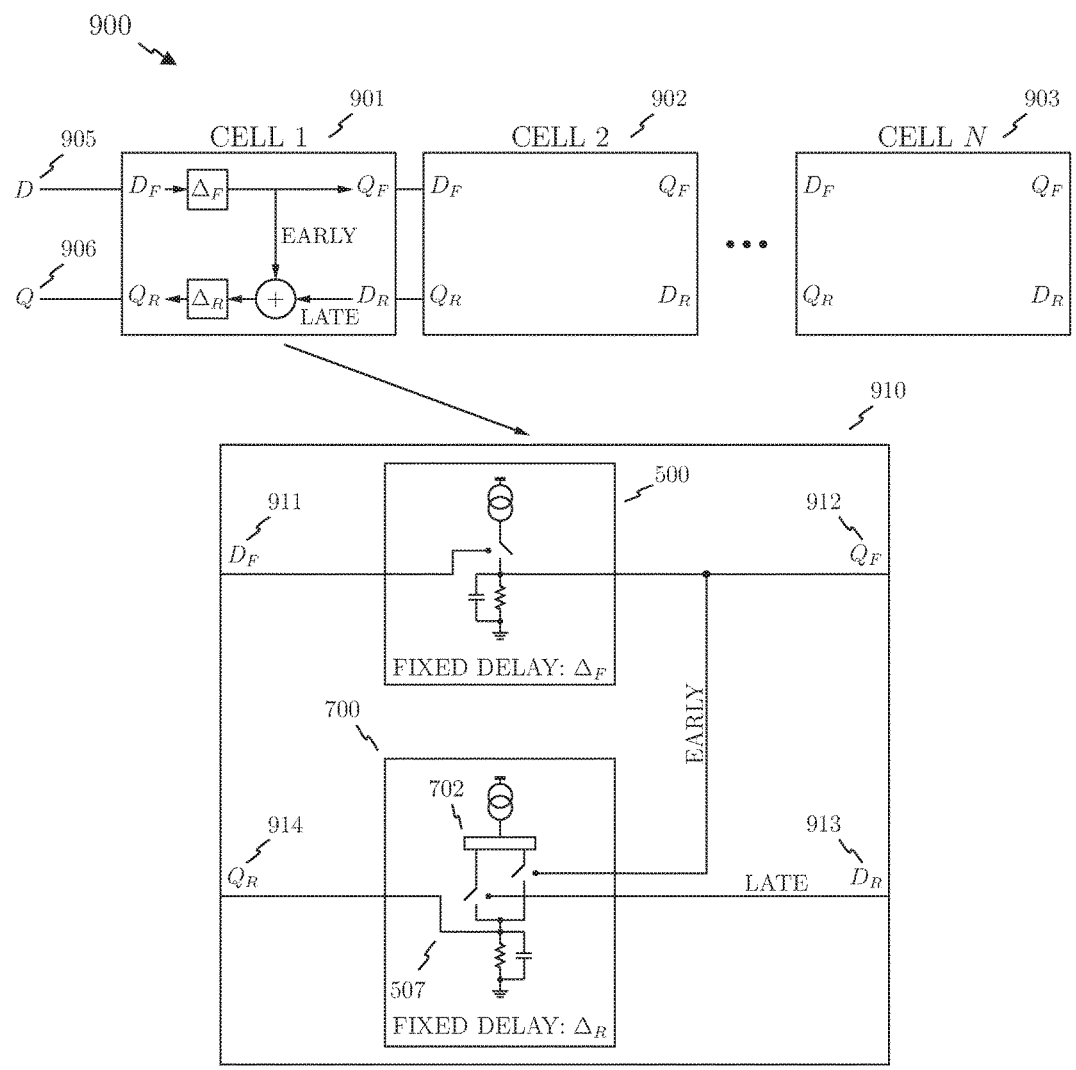
FIG. 9 illustrates generally an example of a deskew cell array and cell detail.

FIG. 9 illustrates generally an example of a deskew cell array 900 and cell detail 910. The example of the cell detail 910 can include or use a forward delay circuit, such as the first circuit 500 from FIG. 5, and an interpolation delay circuit, such as the second circuit 700 from FIG. 7. The deskew cell array 900 includes n different deskew cells, such as including at least a first cell 901, or Cell 1, coupled to a second cell 902, or Cell 2. The examples 400, 410, and 420 illustrated generally a problem that includes generating fixed delays and interpolating between two signals with substantially different delays. The deskew cell detail 910 shows one example of a solution. In an example, the first circuit 500 can be used to generate a forward delay $\Delta_F$, and the second circuit 700 can be used to generate a reverse delay $\Delta_R$ and interpolate two signals with substantially different delays.

Various cell configurations were discussed in the example of FIGS. 4A-4C, including an interpolation configuration, a loop-back configuration, and a pass-through configuration. The example represented by the cell detail 910 can be configured to operate in any one or more of these configurations. In the interpolation configuration, a signal enters the cell through the forward input node 911, is delayed by $\Delta_F$ as it travels through the forward delay circuit 500, and passes to the early signal input node of the interpolation delay circuit 700 and the forward output node 912, where it can propagate to an adjacent cell in the array. A signal returns from the adjacent cell in the array, such as with an added delay, through the reverse input node 913, and passes to the late signal input node of the interpolation delay circuit 700. In the interpolation configuration, the current splitter 702 of the interpolation delay circuit 700 is configured to divide the source current signal $I_{CTRL}$ between $I_{EARLY}$ and $I_{LATE}$ such as to generate a signal with a fixed delay $\Delta_R$ and a delay between that of the signal at the early signal input node and the signal at the late signal input node. This signal then passes from the output node 507 of the interpolation delay circuit 700 to the reverse output node 914.

The loop-back configuration and pass-through configuration can correspond to specific settings or operating conditions of the interpolation configuration. In the loop-back configuration, the current splitter 702 of the interpolation delay circuit 700 can be configured such that all the source current signal $I_{CTRL}$ passes to $I_{EARLY}$ and no current passes to $I_{LATE}$. This results in a signal that depends on the signal at the early signal input node. In the pass-through configuration, the current splitter 702 of the interpolation delay circuit 700 is configured such that all the source current signal $I_{CTRL}$ passes to $I_{LATE}$ and no current passes to $I_{EARLY}$. This results in a signal that depends on the signal at the late signal input node and comes from the output of the next adjacent cell. Using these three configurations, any delay from a minimum of $(\Delta_F + \Delta_R)$ up to a maximum of $[n \times \Delta_F + n \times \Delta_R]$ can be generated, as described above in the discussion of FIGS. 4A-4C.

Figure 10:
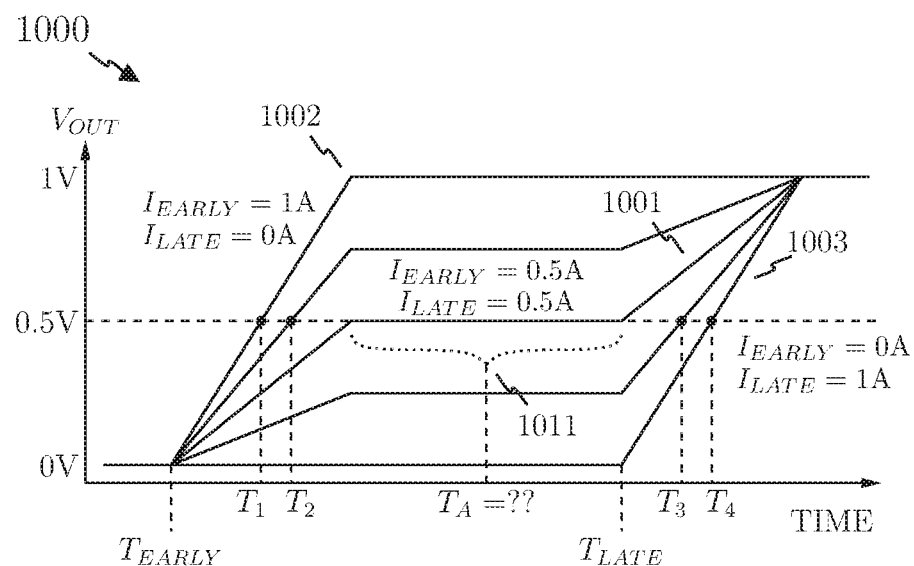
FIG. 10 illustrates generally a relationship between an output node signal and a source current signal.

FIG. 10 illustrates generally an example showing a third relationship between an output node signal and a source current signal. The example of FIG. 10 includes a chart 1000 showing a potential problem with the interpolation technique provided by the circuit of example 700 in FIG. 7. Comparing the chart 800 of FIG. 8 and the chart 1000, it can be seen that $T_{LATE}$ in chart 1000 arrives later than $T_{LATE}$ in chart 800, relative to $T_{EARLY}$. In other words, chart 1000 shows more delay between $T_{EARLY}$ and $T_{LATE}$ than chart 800. In the example of FIG. 10, a first trace 1001 indicates that the voltage at the output node, $V_{OUT}$, spends a relatively large amount of time near the threshold voltage, or 0.5 V. The duration of time spent in this threshold region is proportional to an amount of resulting signal delay non-linearity. As the delay between $T_{EARLY}$ and $T_{LATE}$ increases, the duration of time spent in the threshold region increases, and therefore increases the signal delay non-linearity.

Figure 11:
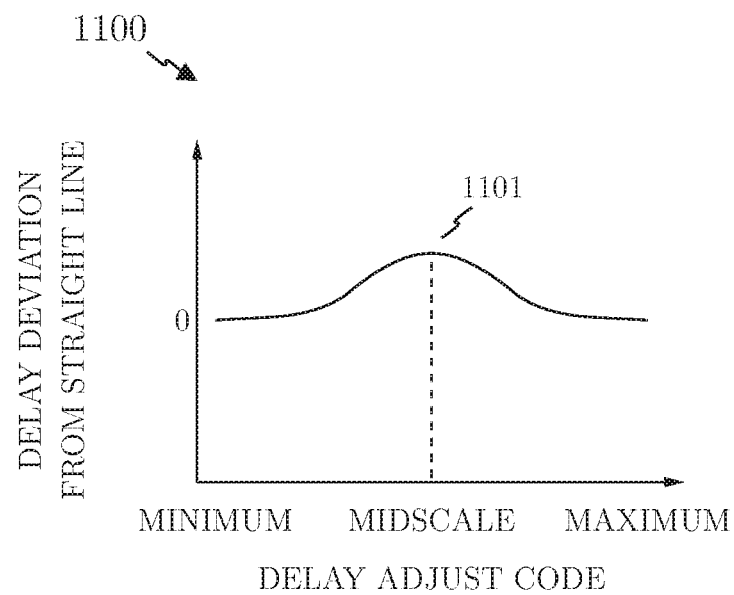
FIG. 11 illustrates generally a relationship between a Delay Adjust Code and a resulting Delay Deviation from an ideal delay characteristic.

FIG. 11 illustrates generally a chart 1100 showing a relationship between a Delay Adjust Code provided to the current splitter 702 of the circuit of example 700 in FIG. 7 and a resulting Delay Deviation from an ideal delay characteristic (i.e., from a straight line, such as the line 301 in FIG. 3). The chart 1100 includes a first delay deviation trace 1101 that illustrates the non-linearity, particularly around the midscale of the available Delay Adjust Code inputs. That is, the non-linearity occurs and is most pronounced near the midscale Delay Adjust Code, corresponding to an equal split of the source current signal $I_{CTRL}$ between the early and late paths.

It is desirable to minimize the width of the non-linear region 1011 to reduce the delay non-linearity. One way to minimize the non-linear region includes reducing a slew rate of the first trace 1001. However, the slew rate of one trace cannot be reduced without also reducing the slew rate of all other traces (see, e.g., second and third traces 1002 and 1003), which leads to an undesirable decrease in signal bandwidth. Another way to minimize the non-linear region includes decreasing the delay duration between the signals that actuate the switches in the early and late current signal paths in the circuit 700. This can shift $T_{LATE}$ to an earlier time (i.e., to the left in the chart 1100), thereby reducing a magnitude or breadth of the non-linearity. However, this also shifts $T_4$ to an earlier time, thereby reducing the maximum available delay.

Figure 12:
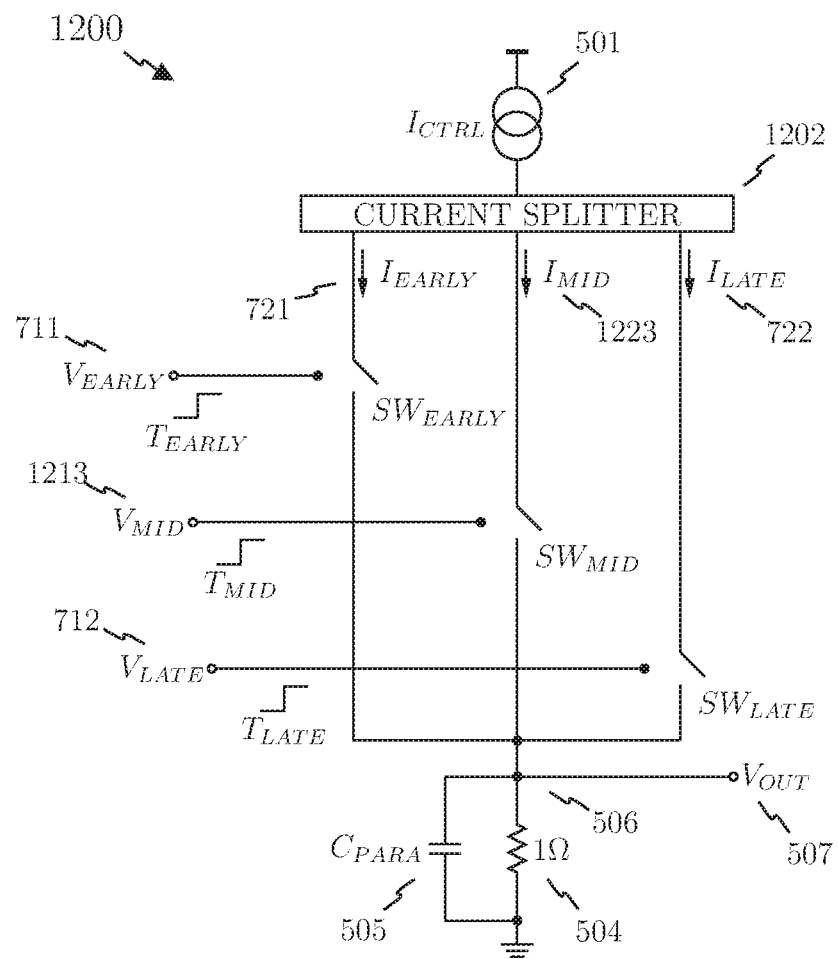
FIG. 12 illustrates generally an example of a circuit that can be used to generate a delay.

FIG. 12 illustrates generally an example of a third circuit 1200 that can be used to generate a delay. The third circuit 1200 can include a modified version of the second circuit 700 from the example of FIG. 7, such as including a third current signal path. The third current signal path 1223, includes a mid switch, $SW_{MID}$, which is actuated by an input signal $V_{MID}$ at a mid signal input node 1213. The current splitter 702 from the second circuit 700 is replaced by a current splitter 1202 that is configured to receive the source current signal $I_{CTRL}$ from the current source 501 and divide the signal into early, mid, and late currents, $I_{EARLY}$, $I_{MID}$, and $I_{LATE}$, respectively. Following the early, late, and mid switches, the first, second, and third current signal paths 721, 722, and 1223 are coupled to an instance of the output circuit block that includes the summing node 506 and output node 507.

Figure 13:
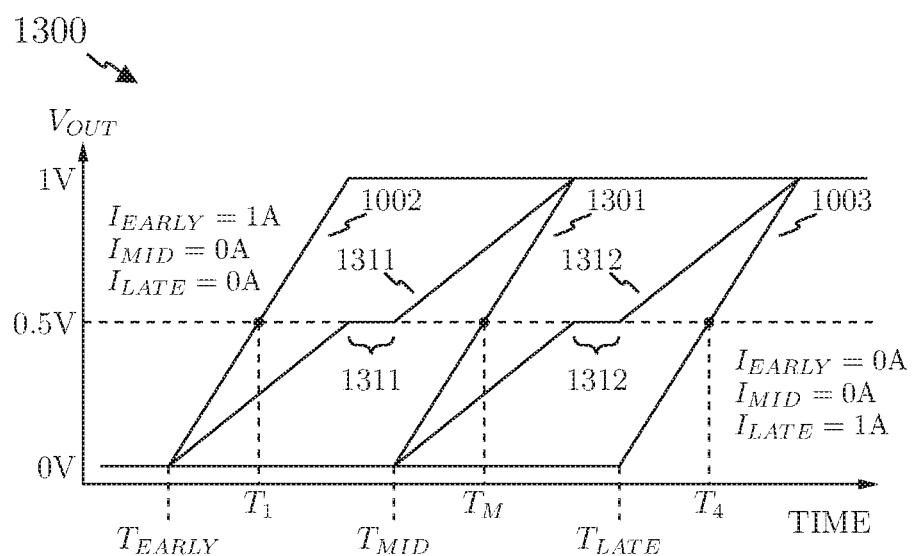
FIG. 13 illustrates generally a relationship between an output node signal and a source current signal.

FIG. 13 illustrates generally an example showing a fourth relationship between an output node signal and a source current signal. The example of FIG. 13 includes a chart 1300 showing the voltage $V_{OUT}$ at the output node 507 of the circuit of FIG. 12, according to examples of different output delays. The delay between $T_{LATE}$ and $T_{EARLY}$ in the chart 1300 is the same as the delay in chart 1000 of FIG. 10. The traces 1002 and 1003 are the same in both charts since all of the current source signal is in the early path and the late path, respectively. However, chart 1300 adds a trace 1301, which corresponds to the current splitter 1202 directing all of the source current signal $I_{CTRL}$ to the mid path, or third current signal path 1223, as $I_{MID}$. The input signal $V_{MID}$ transitions at a time $T_{MID}$, which occurs between $T_{EARLY}$ and $T_{LATE}$. A trace 1311 corresponds to a signal at the summing node when the current splitter 1202 divides the source current signal $I_{CTRL}$ equally between $I_{EARLY}$ and $I_{MID}$ with no current in $I_{LATE}$. Likewise, a trace 1312 shows a signal at the summing node when the current splitter 1202 divides the source current signal $I_{CTRL}$ equally between $I_{MID}$ and $I_{LATE}$ with no current in $I_{EARLY}$. Comparing the time spent near the logic threshold 1311 and 1312 in chart 1300 with 1011 in chart 1000, it can be seen that the time near the logic threshold in chart 1300 is substantially reduced when the mid input signal and mid path are used.

Figure 14:
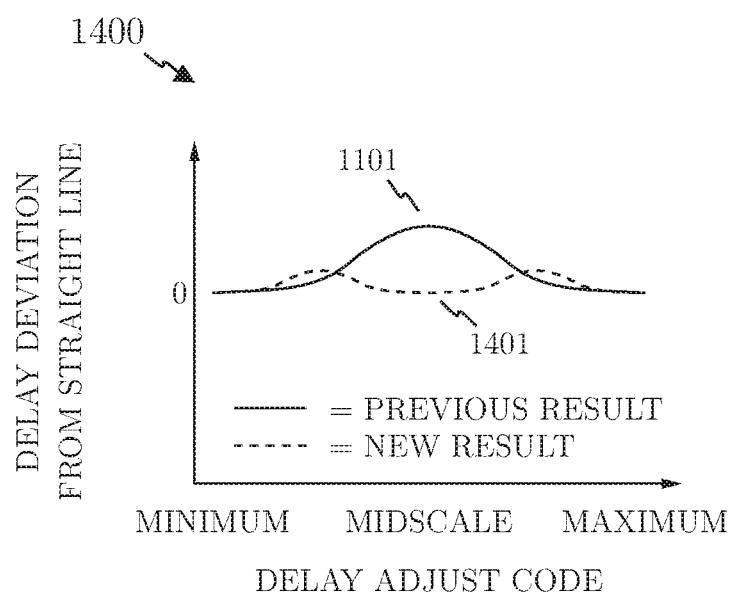
FIG. 14 illustrates generally a relationship between a Delay Adjust Code and a resulting Delay Deviation from an ideal delay characteristic.

FIG. 14 illustrates generally a relationship between a Delay Adjust Code and a resulting Delay Deviation from an ideal delay characteristic. FIG. 14 includes a chart 1400 showing the first delay deviation trace 1101 from FIG. 11, such as corresponding to a relatively large delay between $T_{EARLY}$ and $T_{LATE}$. As previously discussed, most non-linearity occurs around the midscale of the available Delay Adjust Codes. A second delay deviation trace 1401 demonstrates a reduced delay deviation, such as corresponding to the third circuit 1200 from the example of FIG. 12, such as with substantially the same delay between $T_{EARLY}$ and $T_{LATE}$. In this case, most of the non-linearity occurs around the Delay Adjust Code corresponding to the current splitter 1202 apportioning the source current signal $I_{CTRL}$ equally between $I_{EARLY}$ and $I_{MID}$, with no current to $I_{LATE}$, or equally between $I_{MID}$ and $I_{LATE}$, with no current to $I_{EARLY}$. Therefore, it can be seen that the third circuit 1200 provides an improved delay linearity compared to the second circuit 700 from FIG. 7.

Figure 15:
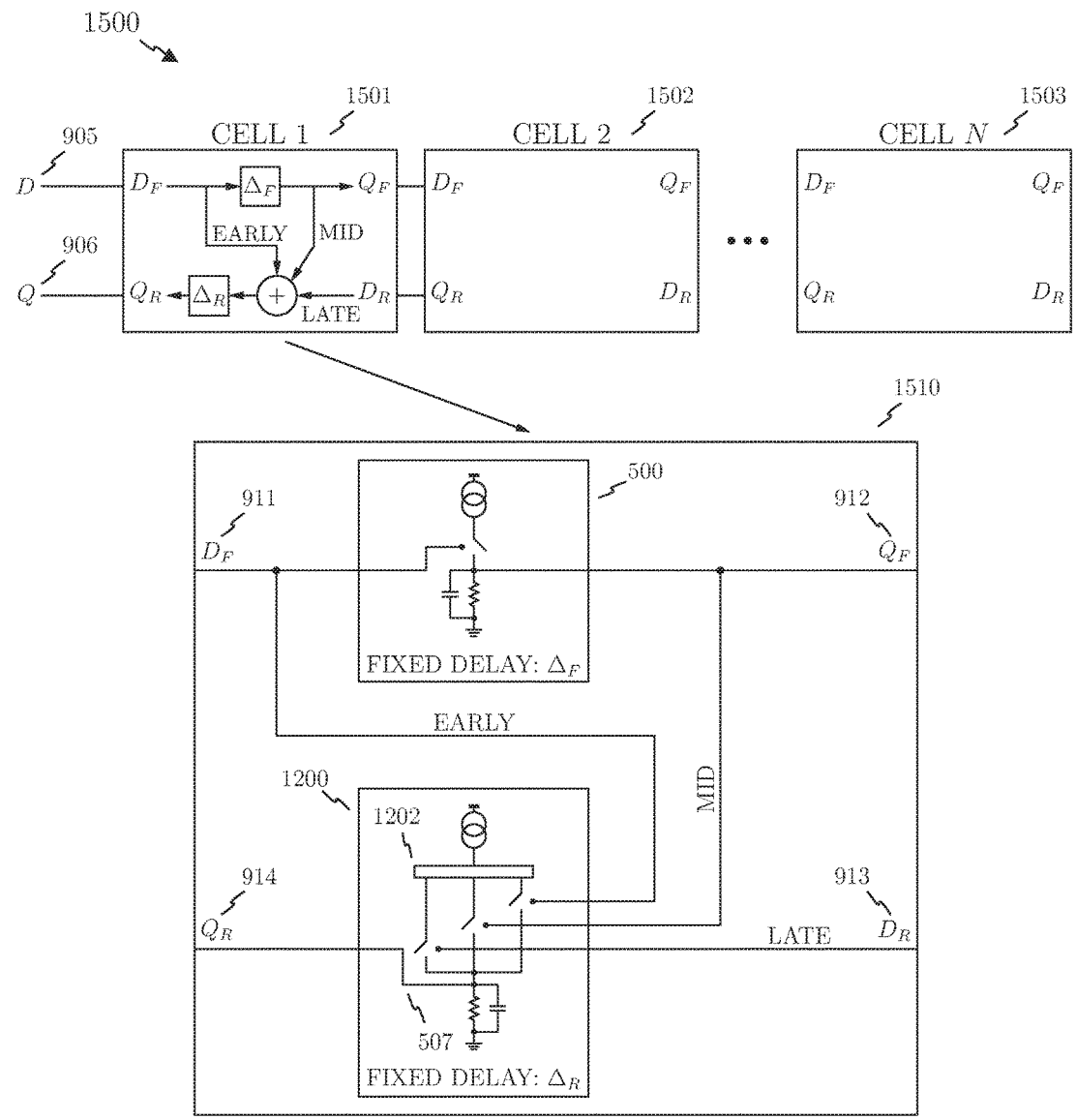
FIG. 15 illustrates generally an example of a deskew cell array and cell detail.

FIG. 15 illustrates generally an example of a second deskew cell array 1500 and second cell detail 1510. To improve the linearity of the array in FIG. 9, the second cell detail 1510 includes an interpolation delay circuit 1200, such as can include or use the third circuit 1200 from the example of FIG. 12. In the second cell detail 1510, the early signal input node of the interpolation delay circuit 1200 is coupled to the forward input node 911 at which a first timing signal (Early) can be received, the mid signal input node is coupled to the forward output node 912 at which a later second timing signal (Mid) can be received, the late signal input node is coupled to the reverse input node 913 at which a further later third timing signal (Late) can be received.

The three configurations discussed above (e.g., the interpolation configuration, the loop-back configuration, and the pass-through configuration) can be adjusted in the following manner. In the interpolation configuration, a signal enters the cell through the forward input node 911 and passes to both the forward delay circuit 500 and the early signal input node of the interpolation delay circuit 1200. The signal then travels from the forward delay circuit 500 with an additional delay of $\Delta_F$ and passes to both the mid signal input node of the interpolation delay circuit 1200 and the forward output node 912, where it can propagate to an adjacent cell in the array. The signal returns from the adjacent cell in the array, with an additional delay, through the reverse input node 913, and passes the signal to the late signal input node of the interpolation delay circuit 1200. In the interpolation configuration, the current splitter 1202 divides the source current signal $I_{CTRL}$ between $I_{EARLY}$ and $I_{MID}$, or between $I_{MID}$ and $I_{LATE}$, such as to generate a signal with a fixed delay $\Delta_R$ and a delay between that of the signal at the early signal input node, the signal at the mid signal input node, and the signal at the late signal input node. This signal then passes from the output node 507 of the interpolation delay circuit 1200 to the reverse output 914.

The loop-back configuration and pass-through configuration are, once again, specific settings, of multiple different available settings, of the interpolation configuration. In the loop-back configuration, the current splitter 1202 of the interpolation delay circuit 1200 is configured such that all the source current signal $I_{CTRL}$ passes to $I_{EARLY}$ and no current passes to $I_{MID}$ or $I_{LATE}$, thereby providing a signal that depends on the signal at the early signal input node. This results in a signal with a delay of $\Delta_R$, as opposed to $(\Delta_F+\Delta_R)$ in the example of FIG. 9. This is because the signal passes from the forward input 911 to the early signal input node of the interpolation delay circuit 1200, and from there to the reverse output 914 of the cell.

In the pass-through configuration, the current splitter 1202 of the interpolation delay circuit 1200 is configured such that all the source current signal $I_{CTRL}$ passes to $I_{LATE}$ and no current passes to $I_{MID}$ or $I_{LATE}$, thereby providing a signal that depends on the signal at the late signal input node. This results is a signal entering the cell through the forward input 911, acquiring a delay of $\Delta_F$, and passing to the forward output node 912, where it can continue through the next adjacent cell. The signal then returns from the adjacent cell, through the reverse input node 913, with some additional delay, passes to the late signal input node of the interpolation delay circuit 1200 where it is delay by $\Delta_R$, and passed to the reverse output node 914. With these three configurations, any delay from a minimum of $\Delta_R$ up to a maximum of $[(n-1)\times\Delta_F + n\times\Delta_R]$ can be generated.

In an example, a limitation of the approach of the circuits and examples shown in FIG. 12 includes bandwidth degradation that is inherent with connecting physically large switches (e.g., $SW_{EARLY}$, $SW_{MID}$, and $SW_{LATE}$) the load resistor 504. This degradation can be problematic since the circuit bandwidth is largely determined by the time constant provided by the capacitor 505 and the load resistor 504. In an example, the capacitor 505 represents a capacitance of the switches $SW_{EARLY}$, $SW_{MID}$, and $SW_{LATE}$ as well as metal routing parasitic capacitances associated with connecting the switches to the summing node 506. A solution to the bandwidth limitation can include reducing a capacitance at the summing node 506, to reduce the time constant and increase the bandwidth.

Figure 16:
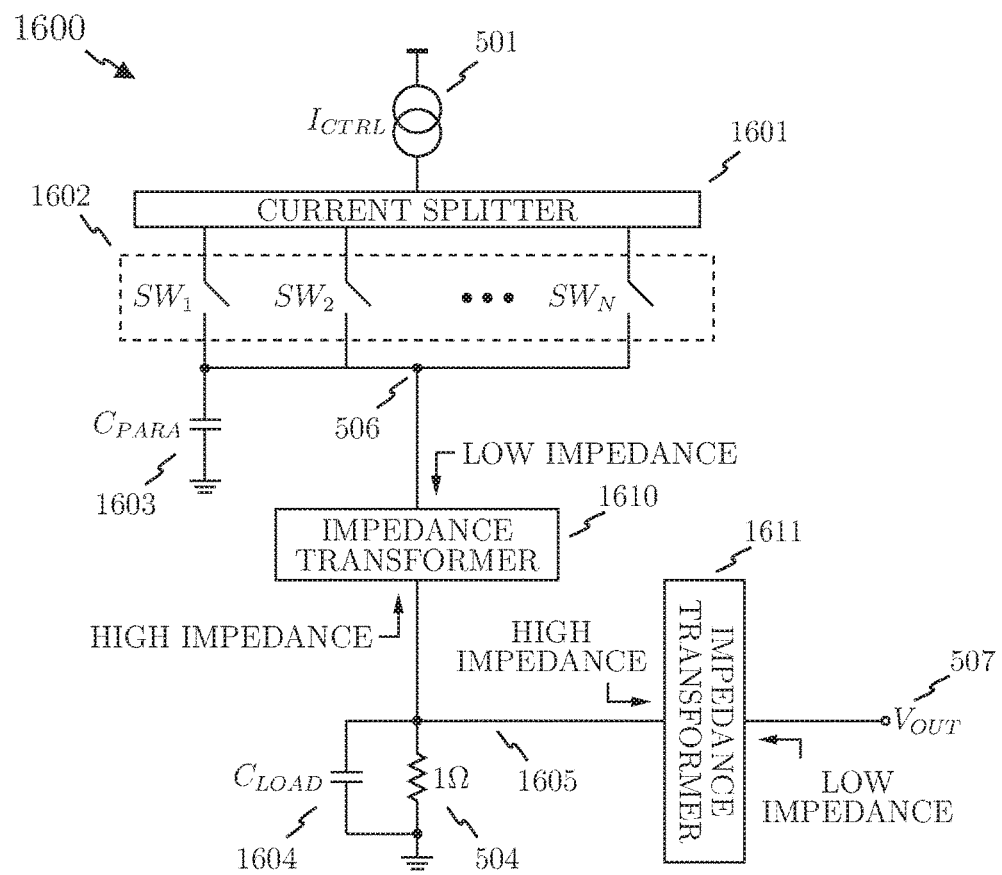
FIG. 16 illustrates generally an example of a circuit that provides an adjustable delay signal using n switching currents and first and second impedance transformer circuits.

FIG. 16 illustrates generally an example 1600 of a circuit that provides an adjustable delay signal using n switching currents and first and second impedance transformer circuits 1610 and 1611. In the example 1600, the circuit includes a current splitter 1601 coupled to multiple parallel signal paths having n respective switches SW1 through $SW_n$. The parallel signal paths drive a common node, the summing node 506, at a low impedance side of the first impedance transformer circuit 1610, and the first impedance transformer circuit 1610 is coupled at a high impedance side to the load resistor 504, a capacitance 1604, and an intermediate node 1605. The intermediate node 1605 is also coupled to a high impedance side of the second impedance transformer circuit 1611, and the second impedance transformer circuit 1611 is coupled at a low impedance side to the output node 507. In an example, the first and second impedance transformer circuits 1610 and 1611 are configured to reduce the capacitance 1604 at the intermediate node 1605. The first impedance transformer circuit 1610 isolates the intermediate node 1605 from a parasitic capacitance 1603 that can result from the switches and routing. The second impedance transformer circuit 1611 isolates the intermediate node 1605 from any additional capacitance at the output node 507, such as can be used to drive an input signal node, as seen in the previous examples.

Figure 17:
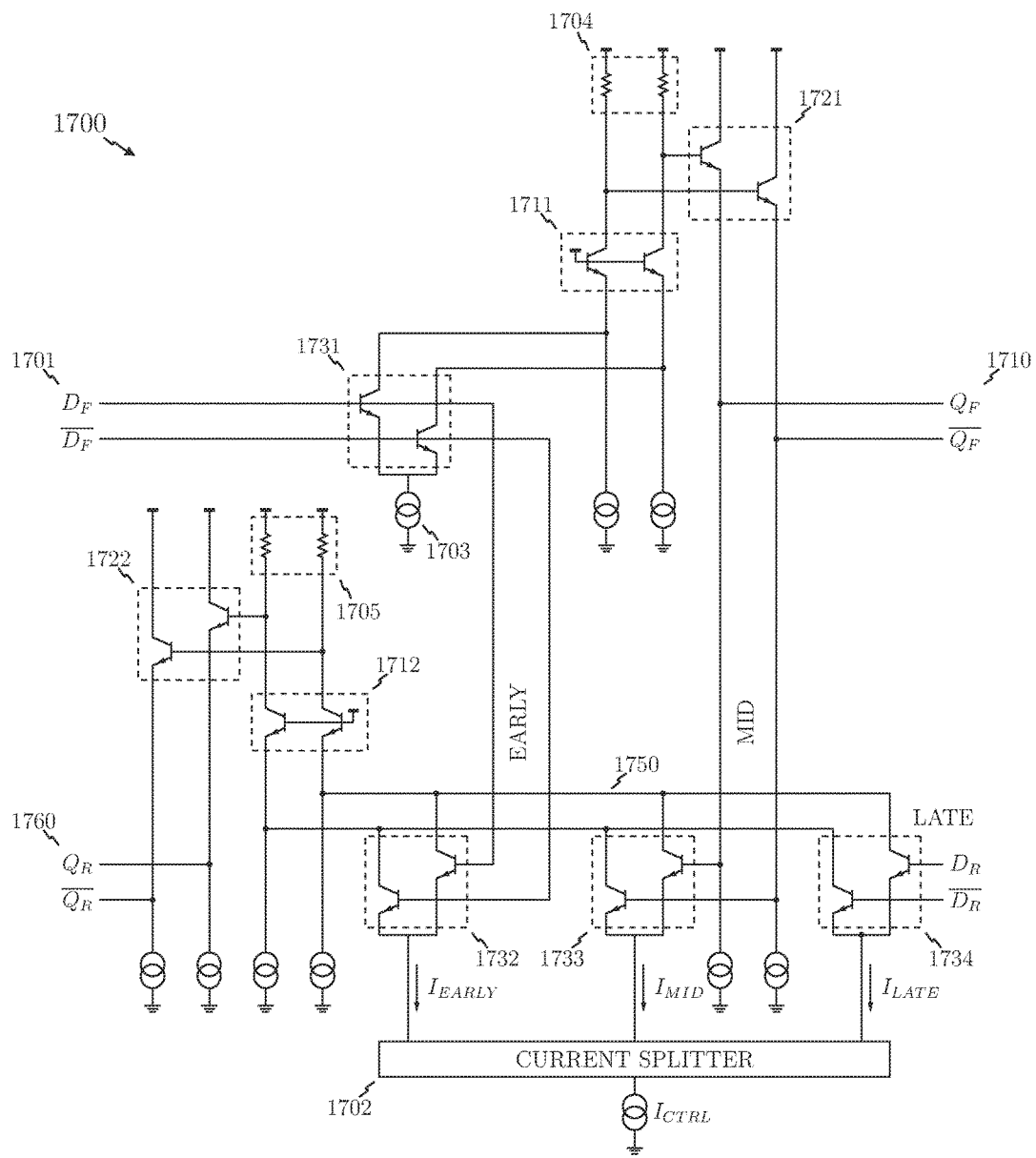
FIG. 17 illustrates generally an example of a transistor-level representation of a deskew cell.

FIG. 17 illustrates generally an example 1700 of a transistor-level representation of a deskew cell, such as corresponding to the conceptual or schematic example of the second cell detail 1510 from the example of FIG. 15. The example 1700 includes a forward input node 1701 that receives the forward input signal $D_F$ at a first differential pair 1731. The first differential pair 1731 acts as a switch, like the switch 502 in the circuit 500, to provide a fixed delay between the forward input signal $D_F$ and the forward output signal $Q_F$. When the forward input signal $D_F$ switches states, a current signal 1703 can be switched from a first to a second side of the first differential pair 1731, thereby causing a voltage transition at the resistors 1704.

In an example, the example 1700 includes first and second impedance transformer circuits between the forward input portion 1701 and a forward output portion 1710. The first impedance transformer circuit can include a first cascode circuit 1711 and the second impedance transformer circuit can include a first emitter-follower circuit 1721. In the example 1700, the first cascode circuit 1711 reduces an impedance seen by the collectors of the first differential pair 1731, to reduce potential bandwidth degradation due to parasitic routing and a capacitance attributed to the first differential pair 1731. The first cascode circuit 1711 and the first emitter-follower circuit 1721 also isolate the node at the summing resistors 1704 from effects of a parasitic capacitance by increasing an impedance at this node. In an example, the first emitter-follower circuit 1721 is configured to provide a signal level shift, such as to negate a level shift caused by the first cascode circuit 1711.

The example 1700 includes second, third, and fourth differential pairs 1732, 1733, and 1734, respectively, that represent the early, mid, and late switches, $SW_{EARLY}$, $SW_{MID}$, and $SW_{LATE}$, respectively. A collector side of each of the second, third, and fourth differential pairs 1732, 1733, and 1734, is coupled to a reverse summing node 1750, and an emitter side of each of the pairs is coupled to a current splitter 1702 (e.g., corresponding to the current splitter 1202 from the example of FIG. 12). The current splitter can apportion a source current signal $I_{CTRL}$ among the early, mid, and late paths corresponding to the second, third, and fourth differential pairs 1732, 1733, 1734, respectively, and according to a delay control signal, or Delay Adjust Code.

In an example, the reverse summing node 1750 can be coupled to a reverse output node 1760 that provides the reverse output signal $Q_R$. When a signal at the output summing node 1750 switches states, a voltage transition occurs at resistors 1705 and at the reverse output signal $Q_R$. In an example, third and fourth impedance transformer circuits 1712 and 1722 can be provided between the reverse summing node 1750 and the reverse output node 1760. The third impedance transformer circuit can include a second cascode circuit 1712, such as provided between the reverse summing node 1750 and the resistors 1705 such that signal summing from the switches, and from the reverse input signal $D_R$, occurs on emitter nodes of the devices in the second cascode circuit 1712. Thus, an impedance at the reverse summing node 1950 can be substantially reduced. The fourth impedance transformer circuit can include a second emitter-follower circuit 1722. The second cascode circuit 1712 and the second emitter-follower circuit 1722 isolate the node at the summing resistors 1705 from the effect of parasitic capacitance at both the reverse summing node 1750 and the reverse output node 1760. In an example, the second emitter-follower circuit 1722 is also configured to provide a signal level shift, such as to negate a level shift caused by the second cascode circuit 1712.

Various Notes

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A deskew system for providing a programmable delay, the system comprising:
    multiple delay cells coupled in a series, wherein a first cell of the multiple delay cells includes a first input node and a first output node, and the first cell is configured to provide a maximum, minimum, or intermediate delay to an input signal at the first input node, and wherein the first cell includes:
    an early signal input node coupled to a forward output node of a preceding cell in the series or to the first input node;
    a mid signal input node;
    a late signal input node coupled to a reverse output node of a subsequent cell in the series; and
    a summing circuit configured to provide a delayed output signal at the first output node by combining signals that are respectively modulated according to a delay adjust code and respective command signals at the early, mid, and late signal input nodes;
    wherein the delay adjust code indicates a delay amount to apply to the input signal.

2. The system of claim 1, further comprising a current splitter configured to apportion early, mid, and late current signals to first, second, and third current paths that are respectively modulated according to the delay adjust code and the command signals at the early, mid, and late signal input nodes.

3. The system of claim 2, wherein the current splitter apportions the early, mid, and late currents from a source current signal; and
    wherein when the delay adjust code indicates a minimum delay amount, the current splitter is configured to apportion substantially all of the source current signal to the first current signal path modulated by the command signal at the early signal input node;
    wherein when the delay adjust code indicates a maximum delay amount, the current splitter is configured to apportion substantially all of the source current signal to the second current signal path modulated by the command signal at the late signal input node; and
    wherein when the delay adjust code indicates an intermediate delay amount, the current splitter is configured to apportion substantially all of the source current to the third current signal path modulated by the command signal at the mid signal input node.

4. The system of claim 2, further comprising an impedance transformer circuit and a summing node at which the early, mid, and late current signals are summed;
    wherein the impedance transformer circuit is coupled to the summing node and configured to condition the summing node to reduce impedance and increase bandwidth at the summing node.

5. The system of claim 4, wherein the impedance transformer circuit comprises a cascode circuit stage that is coupled to the summing node, and an emitter follower circuit stage that is coupled to the cascode circuit stage.

6. The system of claim 1, wherein the early signal input node of the first delay cell is configured to receive a first timing signal from the forward output node of the preceding cell; and
  wherein the late signal input node of the first delay cell is configured to receive a later second timing signal from the reverse output node of the subsequent cell.

7. The system of claim 1, further comprising, in the first cell, a first delay circuit configured to receive the input signal and, in response, provide a first delayed command signal to the mid signal input node.

8. The system of claim 7, wherein the early signal input node of the first delay cell is coupled to the first input node and receives the input signal.

9. The system of claim 8, further comprising, in the first cell, a second delay circuit configured to receive respective command signals from one or more of the early signal input node, the mid signal input node, and the late signal input node, and, in response, provide the delayed output signal at the first output node.

10. The system of claim 1, wherein the early, mid, and late signal input nodes are configured to receive the command signals sequentially.

11. An apparatus coupled between an input node and an output node for delaying an electrical signal received at the input node and providing a corresponding delayed signal at the output node, the apparatus comprising:
  a current splitter coupled to a current source and configured to provide respective portions of a source current signal to at least first, second, and third current signal paths, wherein each of the first, second, and third current signal paths is enabled by an early timing signal, a late timing signal; and an intermediate timing signal, respectively, to conduct its respective portion of the source current signal;
  wherein the early timing signal is based on the electrical signal received at the input node;
  wherein the late timing signal is based on the electrical signal received at the input node and a first delay;
  wherein the intermediate timing signal is based on the electrical signal received at the input node and a different second delay;
  wherein a timing of the delay signal provided at the output node is based on the early, late, and intermediate timing signals; and
  an impedance transformer circuit coupled between the output node and the first, second, and. third current signal paths, wherein the impedance transformer circuit is configured to reduce an impedance characteristic of the output node.

12. The apparatus of claim 11, wherein each of the first, second, and third current signal paths includes a respective path switch that switches between conducting and non-conducting configurations based on the early timing signal, the late timing signal, and the intermediate timing signal, respectively, to modulate current flow through the current signal paths.

13. The apparatus of claim 11, wherein the current splitter is configured to provide the respective portions of the source current signal to one or more of the first, second, and third current signal paths, according to a delay adjust code that indicates a specified signal delay amount.

14. The apparatus of claim 11, further comprising an input configured to receive a delay adjust code that indicates a specified delay amount to apply to the electrical signal received at the input node;
  wherein when the delay adjust code indicates a minimum delay amount, the current signal divider is configured to provide the source current signal to the first current signal path modulated according to the early timing signal;
  wherein when the delay adjust code indicates a maximum delay amount, the current signal divider is configured to provide the source current signal to the second current signal path modulated according to the late timing signal; and
  wherein when the delay adjust code indicates an intermediate delay amount, the current signal divider is configured to provide the source current signal to the third current signal path modulated according to the intermediate timing signal.

15. The apparatus of claim 11, wherein the impedance transformer circuit includes a cascode arrangement of transistors and an emitter follower arrangement of transistors, and wherein the first, second, and third timing signal paths are coupled at a summing node.

16. The apparatus of claim 11, wherein the early timing signal is received from a preceding first delay cell in a series of delay cells, and wherein the late timing signal is based in part on an output signal from a subsequent second delay cell in the same series of delay cells.

17. A method for providing a programmable delay signal, the method comprising:
  receiving an input control signal to be delayed at a forward input node of a first deskew cell in a series of deskew cells, wherein the first deskew cell is configured to provide a first delayed output control signal;
  receiving a delay adjust code indicative of a specified delay amount;
  apportioning a source signal to first, second, and/or third signal paths in the first deskew cell based on the delay adjust code to provide a minimum delay, maximum delay, or intermediate delay, respectively;
  based on at least one control signal from an adjacent cell in the series of deskew cells, modulating signals in one or more of the first, second, and third signal paths; and
  combining signals from the first, second, and third signal paths to provide the output control signal at an output node.

18. The method of claim 17, wherein the modulating control signals in one or more of the signal paths includes switching first, second, and/or third switches respectively provided in the first, second, and third signal paths, wherein switching the first switch includes using the input control signal, wherein switching the third switch includes using a forward control signal provided from the first deskew cell to an adjacent cell in the series of deskew cells, and wherein switching the second switch includes using a further delayed control signal received from the reverse output of the same adjacent cell in the series of delay cells.

19. The method of claim 18, further comprising:
  providing a minimum delay output control signal when the first switch conducts current in the first current signal path and the second and third switches are not conducting;
  providing a maximum delay output control signal when the second switch conducts current in the second current signal path and the first and third switches are not conducting; and
  providing an intermediate delay output control signal when the third switch conducts current in the third current signal path and the first and second switches are not conducting.

20. The method of claim 18, further comprising providing a forward output control signal to the same adjacent cell in the series of deskew cells, the forward output control signal based on the input control signal and a fixed delay amount provided by the first deskew cell.

21. The method of claim 17, further comprising changing an impedance characteristic at the output node using an impedance transformer circuit comprising a cascode arrangement of transistors and an emitter follower arrangement of transistors.

* * * * *

UNITED STATES PATENT AND TRADEMARK OFFICE
CERTIFICATE OF CORRECTION

PATENT NO. : 10,547,294 B2  
APPLICATION NO. : 15/618923  
DATED : January 28, 2020  
INVENTOR(S) : Mort et al.

Page 1 of 1

It is certified that error appears in the above-identified patent and that said Letters Patent is hereby corrected as shown below:

In the Claims

In Column 15, Line 34, in Claim 11, delete "signal;" and insert --signal,-- therefor In Column 15, Line 48, in Claim 11, delete "and." and insert --and-- therefor Signed and Sealed this  
First Day of September, 2020

Andrei Iancu  
*Director of the United States Patent and Trademark Office*